(12) United States Patent
Kley (10) Patent No.: US 9,423,693 B1
(45) Date of Patent: Aug. 23, 2016

(54) IN-PLANE SCANNING PROBE MICROSCOPY TIPS AND TOOLS FOR WAFERS AND SUBSTRATES WITH DIVERSE DESIGNS ON ONE WAFER OR SUBSTRATE

(71) Applicant: Victor B. Kley, Berkeley, CA (US)

(72) Inventor: Victor B. Kley, Berkeley, CA (US)

( * ) Notice: Subject to any disclaimer, the term of this patent is extended or adjusted under 35 U.S.C. 154(b) by 0 days.

(21) Appl. No.: 14/207,088

(22) Filed: Mar. 12, 2014

Related U.S. Application Data (60) Provisional application No. 61/800,971, filed on Mar. 15, 2013.

(51) Int. Cl.
*G03F 7/20* (2006.01)
*G03F 7/36* (2006.01)

(52) U.S. Cl.
CPC ... *G03F 7/20* (2013.01); *G03F 7/36* (2013.01)

(58) Field of Classification Search
CPC ..................................... G03F 7/36; G03F 7/20
USPC .................. 430/296, 320, 942; 250/309, 310; 977/875, 878, 879
See application file for complete search history.

(56) References Cited

U.S. PATENT DOCUMENTS

| | | | |
|---|---|---|---|
| 3,955,179 A | 5/1976 | Planke |
| 4,403,834 A | 9/1983 | Kley |
| 4,435,616 A | 3/1984 | Kley |
| 4,456,731 A | 6/1984 | Caporossi et al. |
| 4,558,359 A | 12/1985 | Kuperman et al. |
| 4,561,731 A | 12/1985 | Kley |
| 4,589,030 A | 5/1986 | Kley |
| 4,604,648 A | 8/1986 | Kley |
| 4,773,029 A | 9/1988 | Claesson et al. |
| 4,782,327 A | 11/1988 | Kley et al. |
| 4,806,776 A | 2/1989 | Kley |
| 4,845,373 A | 7/1989 | Jamieson et al. |
| 4,873,651 A | 10/1989 | Raviv |
| 4,914,293 A | 4/1990 | Hayashi et al. |
| 4,935,728 A | 6/1990 | Kley |
| 5,081,353 A | 1/1992 | Yamada et al. |
| 5,126,574 A | 6/1992 | Gallagher |
| 5,229,607 A | 7/1993 | Matsui et al. |
| 5,235,187 A | 8/1993 | Arney et al. |
| 5,239,297 A | 8/1993 | Kley |
| 5,260,926 A | 11/1993 | Kuroda et al. |
| 5,377,552 A | 1/1995 | Kley |
| 5,394,741 A | 3/1995 | Kajimura et al. |
| 5,448,399 A | 9/1995 | Park et al. |
| 5,689,063 A | 11/1997 | Fujiu et al. |
| 5,751,683 A | 5/1998 | Kley |
| 5,756,997 A | 5/1998 | Kley |
| 5,808,977 A | 9/1998 | Koyanagi |
| 5,828,532 A | 10/1998 | Ahlert et al. |
| 5,844,251 A | 12/1998 | MacDonald et al. |
| 5,877,412 A | 3/1999 | Muramatsu et al. |
| 5,912,934 A | 6/1999 | Acks et al. |
| 5,952,657 A | 9/1999 | Alexander et al. |
| 6,028,305 A | 2/2000 | Minne et al. |
| 6,108,077 A | 8/2000 | Heaton et al. |
| 6,144,028 A | 11/2000 | Kley |
| 6,194,711 B1 | 2/2001 | Tomita et al. |
| 6,219,063 B1 | 4/2001 | Bouguet et al. |
| 6,229,138 B1 | 5/2001 | Kley |
| 6,232,597 B1 | 5/2001 | Kley |
| 6,242,734 B1 | 6/2001 | Kley |
| 6,243,474 B1 | 6/2001 | Tai et al. |
| 6,249,000 B1 | 6/2001 | Muramatsu et al. |
| 6,252,226 B1 | 6/2001 | Kley |
| 6,265,711 B1 | 7/2001 | Kley et al. |
| 6,281,491 B1 | 8/2001 | Kley |
| 6,337,479 B1 | 1/2002 | Kley |
| 6,339,217 B1 | 1/2002 | Kley |
| 6,349,113 B1 | 2/2002 | Mech et al. |
| 6,353,219 B1 | 3/2002 | Kley |
| 6,369,379 B1 | 4/2002 | Kley |
| 6,396,054 B1 | 5/2002 | Kley |
| 6,507,533 B2 | 1/2003 | Sato |
| 6,515,277 B1 | 2/2003 | Kley |
| 6,611,617 B1 | 8/2003 | Crampton |
| 6,621,080 B2 | 9/2003 | Yamamoto |
| 6,635,870 B1 | 10/2003 | Pachuta et al. |
| 6,677,565 B1 | 1/2004 | Wahl et al. |
| 6,797,952 B2 | 9/2004 | Kaito et al. |

(Continued)

FOREIGN PATENT DOCUMENTS

| | | |
|---|---|---|
| EP | 0932020 A1 | 7/1999 |
| EP | 1359593 A1 | 11/2003 |

(Continued)

OTHER PUBLICATIONS

Chang Liu, Associate Professor, University of Illinois at Urbana-Champaign Department of Electrical and Computer Engineering biography, downloaded on Sep. 21, 2006 from http://www.ece.uiuc.edu/faculty/faculty.asp?changliu, 2 pages.

Doll et al., "Low-Energy Electron Beam Focusing in Self-Organized Porous Alumina Vacuum Windows," Applied Physics Letters 76(24): 3635-3637 (2000).

Extended European Search Report for EPO Application No. 07875106.2 mailed Nov. 2, 2009, 9 pages.

Herndon et al., "Near-Field Scanning Optical Nanolithography Using Amorphous Silicon Photoresists," Applied Physics Letters 71(1): 141-143 (1999).

(Continued)

*Primary Examiner* — Christopher Young (74) *Attorney, Agent, or Firm* — Kilpatrick Townsend & Stockton LLP (57) ABSTRACT

Cantilevers, SPM tips and nanomachining tools are created in the plane of wafers to obtain new and high performance parts. The method produces more parts for any given wafer, then conventional methods and allows every part on any given wafer to be different from any other, permitting great freedom in new SPM and nanomachining techniques and product development.

14 Claims, 6 Drawing Sheets

(56) References Cited

U.S. PATENT DOCUMENTS

| | | |
|---|---|---|
| 6,819,698 B1 | 11/2004 | Vogler |
| 6,894,287 B2 | 5/2005 | Fukuda et al. |
| 7,027,642 B2 | 4/2006 | Rubbert et al. |
| 7,045,780 B2 | 5/2006 | Kley |
| 7,106,898 B2 | 9/2006 | Bouguet et al. |
| 7,196,711 B2 | 3/2007 | Wang et al. |
| 7,241,994 B2 | 7/2007 | Hasegawa et al. |
| 7,323,890 B2 | 1/2008 | Petersen et al. |
| 7,340,944 B2 | 3/2008 | Beyder et al. |
| 7,417,213 B2 | 8/2008 | Krief et al. |
| 7,569,077 B2 | 8/2009 | Kollin |
| 7,571,638 B1 | 8/2009 | Kley |
| 7,588,605 B2 | 9/2009 | Ookubo |
| 7,617,719 B2 | 11/2009 | Su et al. |
| 7,631,547 B2 | 12/2009 | Yoshimatsu et al. |
| 7,690,047 B2 | 3/2010 | Yasuda et al. |
| 2002/0096633 A1 | 7/2002 | Gimzewski et al. |
| 2004/0046119 A1 | 3/2004 | Lutter |
| 2004/0060904 A1 | 4/2004 | Herschbein et al. |
| 2008/0135750 A1 | 6/2008 | Kley |
| 2008/0142709 A1* | 6/2008 | Sumant et al. ............... 250/306 |
| 2009/0032706 A1 | 2/2009 | Prater et al. |
| 2010/0031405 A1 | 2/2010 | Kley |

FOREIGN PATENT DOCUMENTS

| | | |
|---|---|---|
| JP | S52-80006 A | 7/1977 |
| JP | H01-262403 A | 10/1989 |
| WO | 2008/156474 A1 | 12/2008 |

OTHER PUBLICATIONS

International Search Report and Written Opinion for PCT Application No. PCT/US2007/070357 mailed Apr. 4, 2008, 4 pages.

Munro's Electron Beam Software Ltd., graphics for FE Gun and Pierce Gun, downloaded on Oct. 24, 2006 from http://www.mebs.co.uk/fegun.htm and http://www.mebs.co.uk/pierce.htm, 3 pages.

Niell, "Electron Gun Beam Extraction with Mosfets," Proceedings of the 1999 Particle Accelerator Conference, pp. 1004-1006 (1999).

Pierce, "Electron Tubes: My Work with Vacuum Tubes at Bell Laboratories," SMEC Vintage Electrics 3(1) (1991), downloaded on Sep. 21, 2006 from http://www.smecc.org/john$_{13}$_r_pierce_electron_tubes.htm, 15 pages.

Stopping and Range of Ions in Matter, "Historical Review," downloaded on Nov. 29, 2006 from http://www.srim.org/SRIM/History/HISTORY.htm, 8 pages.

Stopping and Range of Ions in Matter, "Particle Interactions with Matter," downloaded on Nov. 29, 2006 from http://www.srim.org, 5 pages.

Tel Aviv University, "The Principle of Electrostatic Accelerator (EA) FEL Operation," downloaded on Sep. 21, 2006 from http://www.eng.tau.ac.il/research/FEL/0a.html, 1 page.

"The 'benchmark test' files," CPO, downloaded on Sep. 21, 2006 from http://www.electronoptics.com/benchmar.htm, 9 pages.

U.S. Appl. No. 11/382,651, filed May 10, 2006 by Kley, now abandoned (unpublished; copy available to the Examiner via the U.S. Patent & Trademark Office's IFW system).

U.S. Appl. No. 60/679,926, filed May 10, 2005 by Kley, now expired (unpublished; copy available to the Examiner via the U.S. Patent & Trademark Office's IFW system).

U.S. Appl. No. 60/698,356, filed Jul. 11, 2005 by Kley, now expired (unpublished; copy available to the Examiner via the U.S. Patent & Trademark Office's IFW system).

U.S. Appl. No. 60/707,840, filed Aug. 11, 2005 by Kley, now expired (unpublished; copy available to the Examiner via the U.S. Patent & Trademark Office's IFW system).

U.S. Appl. No. 60/711,899, filed Aug. 25, 2005 by Kley, now expired (unpublished; copy available to the Examiner via the U.S. Patent & Trademark Office's IFW system).

Vaughan, "Synthesis of a Hollow-Beam Pierce Gun," IEEE: Transactions on Electron Devices ED-34(2): 468-472 (1987).

Yakovlev et al., "100 MW Electron Gun for a 34.4 GHz Magnicon," Proceedings of the 2001 Particle Accelerator Conference, pp. 1041-1043 (2001).

* cited by examiner

IN-PLANE SCANNING PROBE MICROSCOPY TIPS AND TOOLS FOR WAFERS AND SUBSTRATES WITH DIVERSE DESIGNS ON ONE WAFER OR SUBSTRATE

CROSS REFERENCE TO RELATED APPLICATIONS

This application claims priority to U.S. Provisional Patent Application No. 61/800,971, filed Mar. 15, 2013 for "In Plane Scanning Probe Microscopy Tips and Tools for Wafers and Substrates with Diverse Designs on One Wafer or Substrate" (Victor B. Kley), the entire disclosure of which is hereby incorporated by reference for all purposes.

The entire disclosures of the following U.S. patents and patent applications are incorporated by reference for all purposes:

U.S. Pat. No. 7,571,638, filed Sep. 12, 2006, entitled "Tool tips with scanning probe microscopy and/or atomic force microscopy applications," which is a continuation-in-part of U.S. patent application Ser. No. 11/382,651, filed May 10, 2006, entitled "Tool Tips with Scanning Probe Microscopy and/or Atomic Force Microscopy Applications," which claims the benefit of each of the following four U.S. provisional applications:

U.S. Provisional Patent Application No. 60/679,926, filed May 10, 2005, entitled "Manufacturing of Micro-Objects Such as Miniature Diamond Tool Tips";

U.S. Provisional Patent Application No. 60/698,356, filed Jul. 11, 2005, entitled "Manufacturing of Micro-Objects Such as Miniature Diamond Tool Tips";

U.S. Provisional Patent Application No. 60/707,840, filed Aug. 11, 2005, entitled "Manufacturing of Micro-Objects Such as Miniature Diamond Tool Tips"; and U.S. Provisional Patent Application No. 60/711,899, filed Aug. 25, 2005, entitled "Manufacturing of Micro-Objects Such as Miniature Diamond Tool Tips."

BACKGROUND OF THE INVENTION

The present invention relates generally to the manufacture and handling of micro-objects such as shaped tool heads or tips, and more particularly to the manufacture of Micro Electro Mechanical Systems (MEMS) used in conjunction with Scanning Probe Microscopes, Optical Microscopes, Electron Microscopes and Ion microscopes.

Manufacturing and other processes pertaining to scanning probe microscopy SPM, nanomachining, micromachining, machining, optics, biotechnology, and biomedicine often require highly specialized miniature tools, imaging techniques and measuring instruments. Such tools typically consist of a shaped tool head formed and parted from a diamond, silicon nitride, silicon carbide, boron nitride, boron carbide, diamond-like carbon, sapphire or other hard material work piece and mounted on a body, cantilever and/or handle. Depending on the particular application, the spatial orientation of the measuring and tool head relative to the tool body, once mounted thereupon, may be critical to the usefulness of the miniature tool. Furthermore, it is desirable to be able to have many different specialized SPM tips on one wafer since the cost of using MEMS manufacturing for all the possible desirable tip, tool and actuation configurations prohibit the expansion of use of these nanotechnologies for research, and in industry.

The specific and actual manufacturing methods herein describe a means for building tool and sensing structures with widely varying properties and effective use of coated or grown obdurate films so as to substantially expand the use and capability of present SPM, TEM, SEM, ion microscope and other measuring and nanomachining and nanomodification and additive processes techniques. In addition, each unique design is assigned an etched-in identifier so that it may be identified even when mounted into a tool or microscope.

SUMMARY OF THE INVENTION

The present invention relates generally to the manufacture and handling of micro-objects such as shaped tool heads or SPM tips, and nanomachining SPM tips, metrology SPM tips, and more particularly to the manufacture of miniature tools incorporating or consisting of shaped structures.

Manufacturing and other processes pertaining to scanning probe microscopy, nanomachining, micromachining, machining, optics, biotechnology, and biomedicine often require highly specialized miniature tools or tips. Such tools typically consist of a shaped tool head formed and parted from a diamond or other hard material work piece and mounted on a body or handle. Depending on the particular application, the spatial orientation of the tool head relative to the tool body, once mounted thereupon, may be critical to the usefulness of the miniature tool or tip.

Execution of present methods for fabricating, identifying, handling, aligning and mounting small structures, particularly structures smaller than 200 microns (referred to as micro-objects), is highly difficult and often results in uncertain orientation of the fine tool head structure relative to the tool body. Present methods for cantilever and tip manufacture also limit the length of tool pieces and make it necessary to provide substantial extra unused material in the tool head which can be expensive and limiting in the use of special high performance materials.

One aspect of the present invention is to provide a method for combining tens, hundreds, or thousands of different and unique tips and tools on one wafer to make diverse functions reasonably inexpensive for research, industrial nanomachining, and metrology. It is a further aspect to have an etched identification such that each cantilever or other part when mounted as it is typically on edge to engage the surfaces in question can be distinguished in function from other mounted tips or tools.

Another aspect of the present invention is to provide the ability to use robust materials such as diamond, nanodiamond, ultrananodiamond, amorphous diamond, silicon nitride, silicon carbide, boron nitride, or boron carbide in a thin and inexpensive layer grown or coated on the wafer of all the parts as we have successfully done and in the process create nanoscale sharp and precise structures suitable for SPM tips and/or tools.

In yet another aspect, we can create cantilevers with unique and special properties pushing out the performance limits of present nanotech instruments and SPM microscopes because by building each structure in the plane of the wafer we are free to make any angle, curve or complex structure which has never before been possible.

The following detailed description together with the accompanying drawings will provide a better understanding of the nature and advantages of the present invention.

DESCRIPTION OF SPECIFIC EMBODIMENTS

In embodiments of the present invention, such techniques can be used to fabricate cantilevers, SPM tips and special measuring and nanomodification tools.

Figure 1:
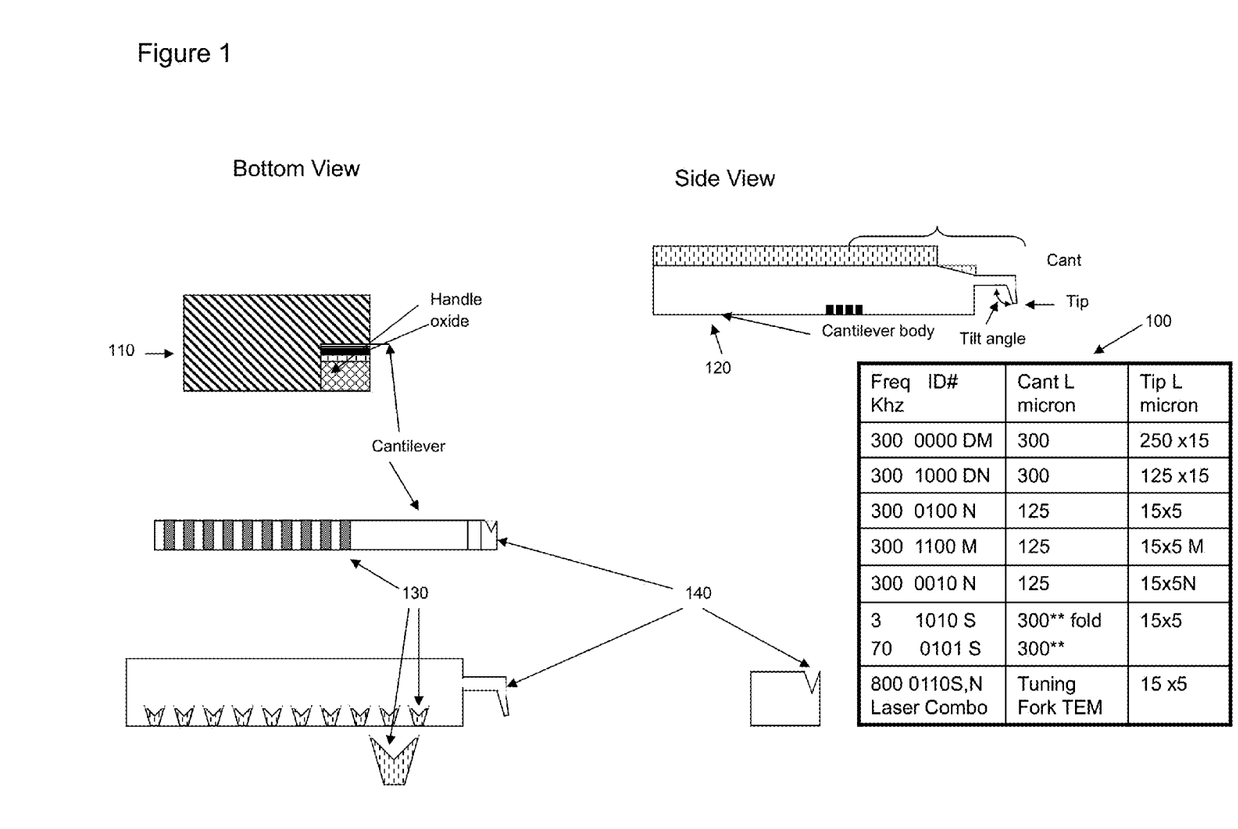
FIG. 1 is a schematic illustration of a general cantilever mounting component.

FIG. 1 shows the table of devices with ID numbers 100 this is both the experimental list used to produce first parts and an example of the tip length, angle with ID number notched into the cantilever body 120, cantilever length 100 and wet etch precision alignment trench 140 that permits the easy identification of parts once mounted on any respective carrier such as 110.

Figure 2:
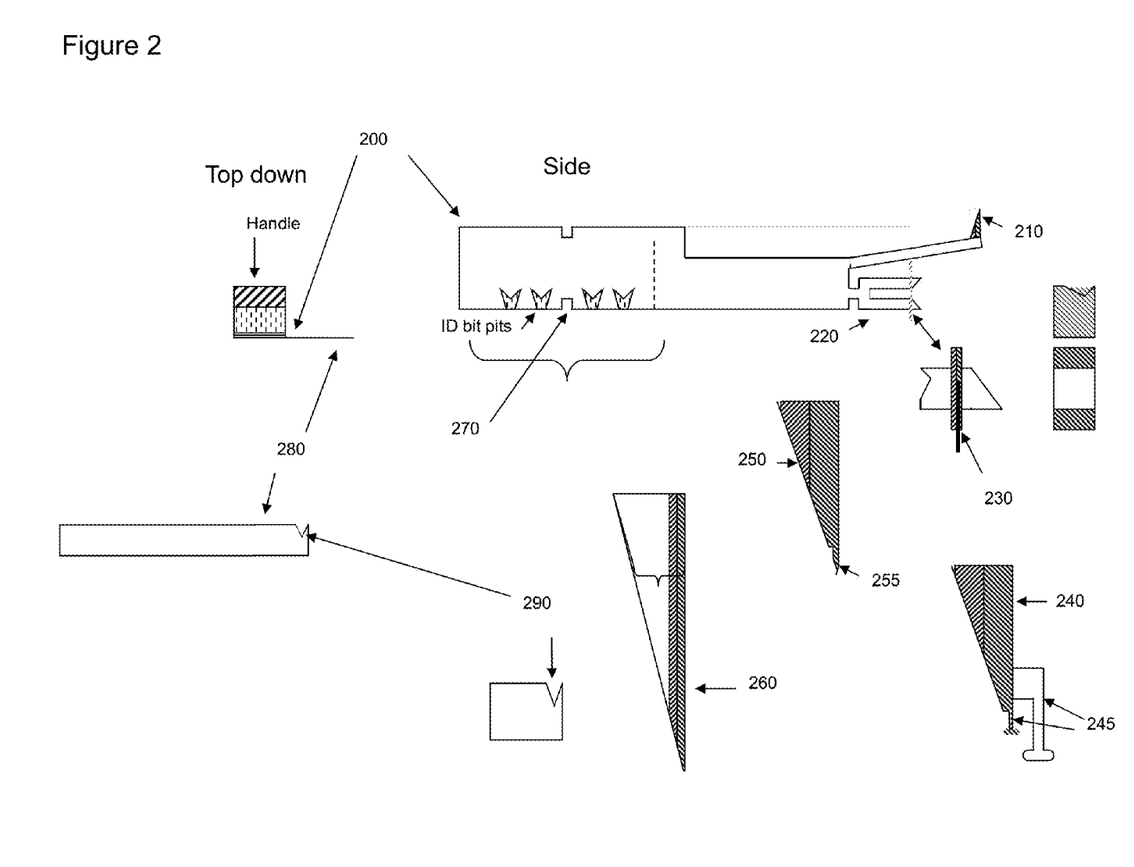
FIG. 2 is a top and side view of tuning fork sensor and cutting tip according to an embodiment of the present invention.

FIG. 2 includes a cross section view and top down view of a tuning fork body 200, tuning fork 220, and nanomachining tip 210. In addition we see four other tip types 230 with its precision atomically accurate V-groove with multiwall carbon nanotube mounted in the groove, 240 and 245 with both the V-groove 240 and the sidewall probe 245. In addition we have the V 250 and side tip 255, the whole cantilever view end on and from above 280. At 270 we see the breakaway which has further improved in FIG. 4, 410. As shown the design is such that the upper tuning fork stub identical to lower stub 230 has only a small gap to the cantilever and nanomachining tip structure 210 where when it engages the stub the stiffness of the cantilever increases many fold.

Figure 3:
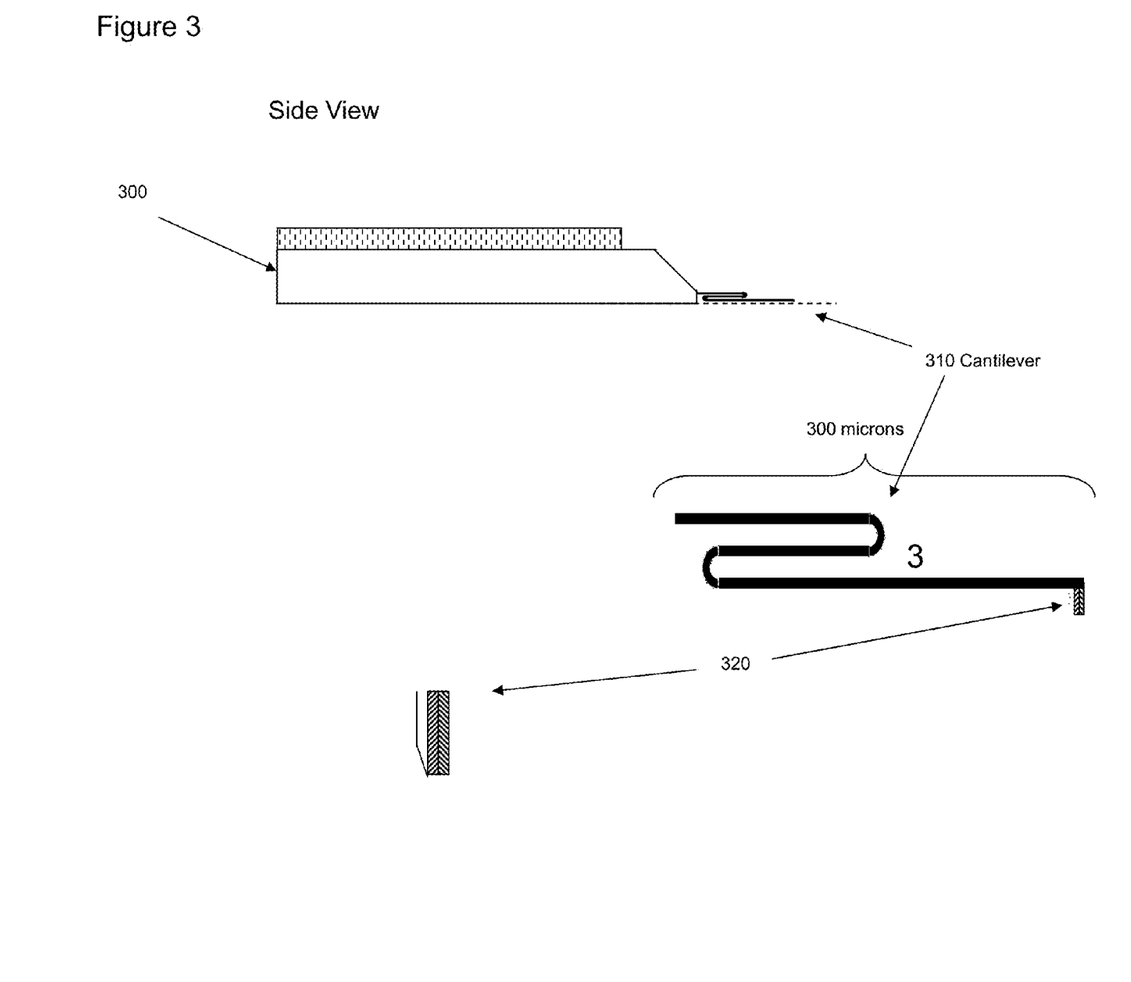
FIG. 3 is a side view and detail view of an extremely low force cantilever with special carbon nanotube tip channel according to an embodiment of the present invention.

FIG. 3 is a side cross section of the very low force folded cantilever 310 and tip 320 along with the complete body, tip, cantilever assembly 300. Any of the listed tip types and any tip angle may be used to construct these assemblies. The force in contact mode of these tips for SPM use is more than 300% less than any other available contact tip. The ease with which we can produce diamond or silicon nitride coated versions with excellent wear characteristics and sharp nearly vertical sides opens up many heretofore undoable measures and experiments.

Figure 4:
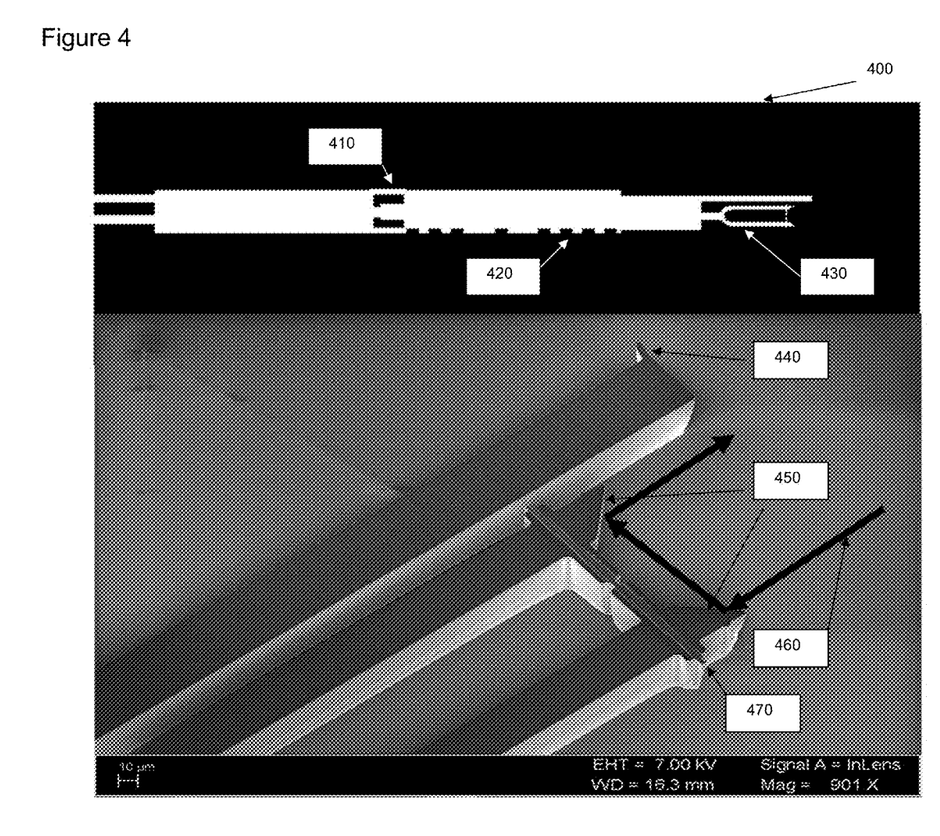
FIG. 4 is a view of a photomask image of a tuning fork and nanomachining cantilever and tip according to an embodiment of the present invention.

FIG. 4 shows a top view and angled view of the actual tuning fork and nanomachining part 400. The top view of the mask element shows the break-away 410 used to shorten the overall body length (which is specifically lengthened to reach into the lens area of Optical, SEM, TEM and Ion microscopes). The unique pit code identifying the part is at 420 and the tuning fork itself at 430. Looking at the actual part the nanomachining tip is at 440 while the precision trench 470 has a multiwall carbon nanotube as the actual tip 470.

The tip is placed into the self-aligning trench 470 along with all other target trenches across the entire wafer using any of the common systems available for picking and placing nanotubes. The perfectly aligned trench insures that the nanotube is precisely perpendicular to the surface it measures or changes. The trench is atomically smooth and its alignment is precisely related to the crystal planes of the silicon wafers on which it is fabricated. This alignment is at least 10 times better than that available by present other means.

The tuning fork can measure surface interactions by the tip in its active arm even though it may be hidden under a microscope objective. It does so by vibrating the tuning fork and then using light beam 460 reflecting off of both 45-degree fork ends 450 and using the small changes in path length determine whether the base resonance is being affected the tip interaction with the surface. This basic MEMS light tuning fork operates with a common light source like a stabilized laser a responsive detector and a resonance subsystem—said system being identical with those commonly used for the common arrangement of the light being reflected off the back side of the cantilever from above.

Figure 5:
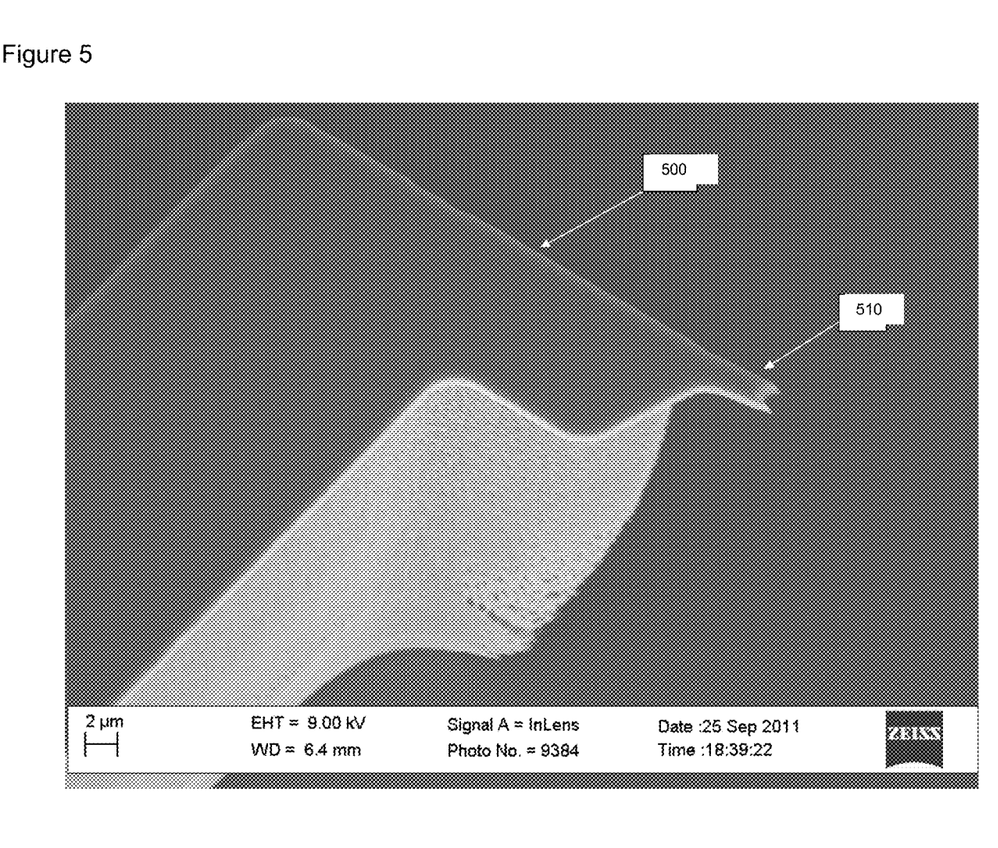
FIG. 5 is a view of the end of cantilever showing the tip formed from the tough and very thin coating on the silicon substrate according to an embodiment of the present invention.

FIG. 5 shows the a tip 510 and cantilever end 500 formed from a thin layer of silicon nitride shaped like a tip under which the original silicon has been substantially etched away so that the tip is about 100 nanometer thick and tapers to a point of about 15 nanometers in accord with the embodiments in the invention.

Figure 6:
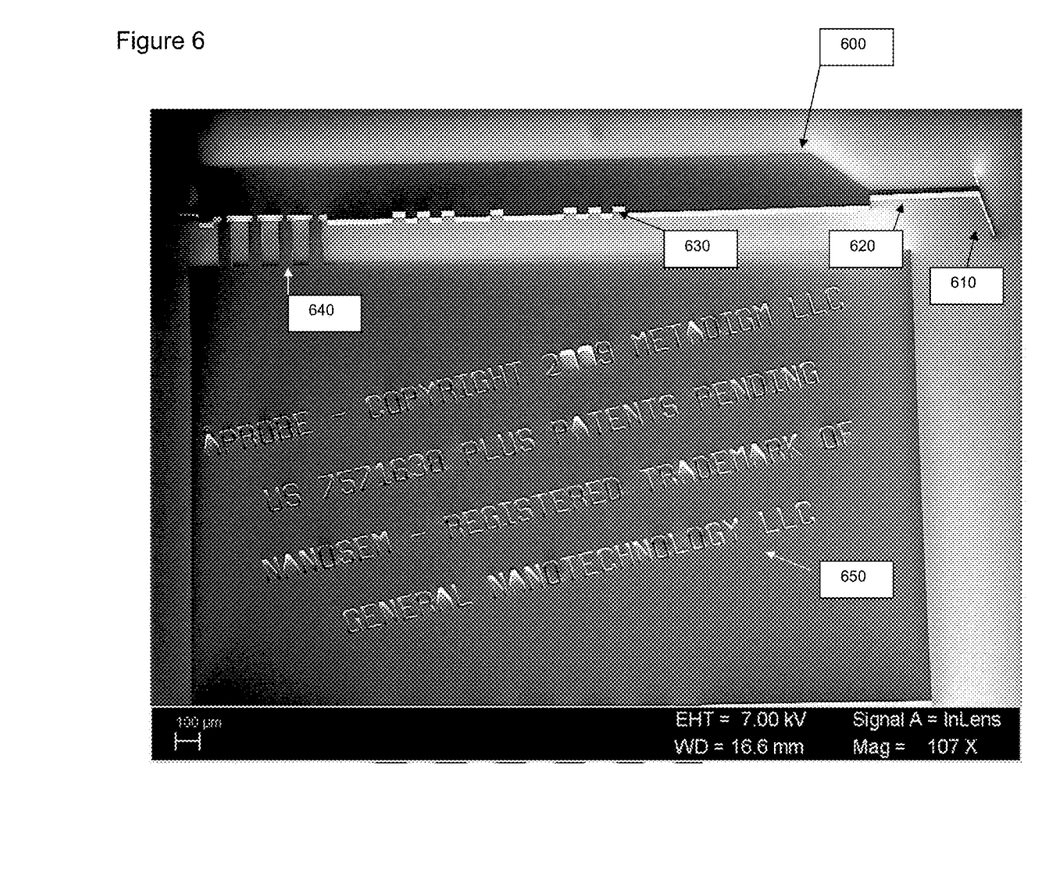
FIG. 6 is a view of a complete tip and extremely long cantilever component with mounting handle, names and copyrights according to an embodiment of the present invention.

FIG. 6 shows the wafer top view of another cantilever assembly 600 and its carrier and handle 650. This a complete experimental part ready be transferred to a specific SPM holder. This very long 300-micron tip 610 is built with a precision trench like 470, a silicon nitride tip, and a cantilever 620. The identification code is at 630 and the break-away to release the cantilever assembly at its final destination is at 640. The history of a development which started in 2007 is reflected in the dates on the silicon, and SEM images (with dates).

In use the method for manufacturing is to expose a silicon oxide coating on a silicon-on-insulator (SOI) or plain wafer to photolithography and/or e-beam lithography to etch the trench using a wet etch process. Then the wafer is coated (or has grown) silicon nitride, silicon carbide, boron nitride, boron carbide, diamond, nanodiamond, ultrananocrystalline diamond, diamond-like carbon, or other suitable tip material. The wafer is then photolithographically and/or E-beam lithographically processed, and etched by dry etch and wet etch steps until all the features are complete and all appropriate structures are released. The entire wafer is then taken to have carbon nanotubes attached in the trenches (or groove) 290. The components as required are checked and clean room packaged for testing. In other embodiments the wafer may be quartz, germanium, silicon carbide, or sapphire.

Thus, although the invention has been described with respect to specific embodiments, it will be appreciated that the invention is intended to cover all modifications and equivalents within the scope of the following claims.

What is claimed is:

1. A method of making SPM probes and tools comprising:
   providing a wafer characterized by a wafer plane; and
   using either or both photolithographic and E-beam lithographic wafer processing techniques for creating a plurality of shapes, suitable for use in SPM and nanomachining, wherein:
   the shapes extend in the wafer plane,
   at least two of the shapes are different, and
   each of at least first and second of the shapes includes a cantilever structure extending in the wafer plane, and a tip structure extending away from the cantilever structure but still being formed in the wafer plane.

2. The method as set forth in claim 1, wherein creating the shapes includes performing a wet etch process in strips extending along the wafer plane to form V-groove trenches having longitudinal and transverse directions that extend along the wafer plane, and a depth that extends into the wafer plane.

3. The method as set forth in claim 1, wherein the cantilever structure of at least one of the shapes is formed with one or more folds.

4. The method as set forth in claim 1, wherein the wafer is any of silicon, Silicon On Insulator, quartz, sapphire, silicon carbide, or germanium.

5. The method as set forth in claim 1, wherein creating the shapes includes forming, for each of a set of shapes having a particular design, a pattern of pits that correspond to a unique design identification for that particular design.

6. The method as set forth in claim 1, wherein the shapes include tuning fork SPM structures to sense tip to surface interactions.

7. The method as set forth in claim 6, wherein at least one of the tuning fork SPM structures includes a nanomachining tip and cantilever wherein as the cantilever touches the tuning fork SPM structure, the stiffness or spring constant of the cantilever increases substantially.

8. The method as set forth in claim 1, wherein the wafer is coated by any combination of silicon nitride, silicon carbide, boron nitride, boron carbide, diamond, nanodiamond, ultrananocrystalline diamond or Diamond Like Carbon.

9. The method as set forth in claim 1, wherein at least one of the tip structures is formed with a wet-etched V-groove trench having longitudinal and transverse directions that extend along the wafer plane, and a depth that extends into the wafer plane, the groove being such that a nanotube can be placed along the longitudinal direction of the groove to extend in the wafer plane.

10. The method as set forth in claim 1, wherein:
   at least one of the tip structures is formed with a wet-etched V-groove trench having longitudinal and transverse directions that extend along the wafer plane, and a depth that extends into the wafer plane, the groove being such that a nanotube can be placed along the longitudinal direction of the groove to extend in the wafer plane; and
   shapes with respective different designs are provided with respective patterns of pits uniquely identifying the respective designs.

11. A method of making SPM probes and tools comprising:
   providing a wafer characterized by a wafer plane; and
   lithographically creating a plurality of shapes that extend in the wafer plane wherein:
      at least two of the shapes are different,
      each of at least first and second of the shapes includes a cantilever structure extending in the wafer plane, and a tip structure extending away from the cantilever structure but still being formed in the wafer plane, and
      the tip structure of least one of the shapes is formed with a wet-etched V-groove trench having longitudinal and transverse directions that extend along the wafer plane, and a depth that extends into the wafer plane, the groove being such that a nanotube can be placed along the longitudinal direction of the groove to extend in the wafer plane.

12. A wafer characterized by a wafer plane comprising a plurality of lithographically formed shapes extending in the wafer plane, wherein:
   at least two of the shapes are different,
   each of at least first and second of the shapes includes a cantilever structure extending in the wafer plane, and a tip structure extending away from the cantilever structure but still being formed in the wafer plane.

13. The wafer as set forth in claim 12, wherein the tip structure of least one of the shapes is formed with a wet-etched V groove trench having longitudinal and transverse directions that extend along the wafer plane, and a depth that extends into the wafer plane, the groove being such that a nanotube can be placed along the longitudinal direction of the groove to extend in the wafer plane.

14. The wafer as set forth in claim 12, wherein shapes with respective different designs are provided with respective patterns of pits uniquely identifying the respective designs.

\* \* \* \* \*